United States Patent [19]

Levine

[11] 4,433,343
[45] Feb. 21, 1984

[54] EXTRINSIC INFRARED DETECTOR WITH DOPANT SITE CHARGE-NEUTRALIZATION

[76] Inventor: Michael A. Levine, 261 E. Alegria Ave. #22, Sierra Madre, Calif. 91024

[21] Appl. No.: 333,465

[22] Filed: Dec. 22, 1981

[51] Int. Cl.³ .................... H01L 27/14; H01L 29/78
[52] U.S. Cl. ...................................... 357/30; 357/24; 357/86
[58] Field of Search ............... 357/30, 86, 31, 24 LR, 357/64

[56] References Cited

U.S. PATENT DOCUMENTS

| | | | |
|---|---|---|---|
| 3,634,143 | 1/1972 | Brennan | 357/30 X |
| 3,856,989 | 8/1973 | Weimer | 357/24 X |
| 4,008,485 | 2/1977 | Miyoshi et al. | 357/64 X |
| 4,223,330 | 9/1980 | Kolke et al. | 357/30 X |
| 4,313,127 | 1/1982 | Su et al. | 357/24 X |

OTHER PUBLICATIONS

"Charge Coupled Devices & Systems", Howes, M. J., Morgan, D. V., Eds., John Wiley and Sons, (1979), pp. 284-292.

Primary Examiner—Martin H. Edlow
Assistant Examiner—J. L. Badgett
Attorney, Agent, or Firm—John M. May

[57] ABSTRACT

A relatively thin layer of extrinsic material formed on the top surface of a nearly intrinsic semiconductor substrate forms the detector area of an infrared detector device. A source region is provided along a portion of the perimeter of the detector area and is electrically coupled to the extrinsic detector area by means of an external connection. A drain channel is provided which is separated from the detector area by a gate region. The concentration of the extrinsic material in the detector area is sufficient for it to be at least a poor conductor. Thus, replacement electrons can flow from the source region into the extrinsic detector area via the external connection and electrical charge-neutrality can thereby be maintained at the extrinsic sites. The gate electrode forms a fringing field extending into the detector area which facilitates conduction from the detector area to the drain channel during the read-out process. An X-Y addressable array of such detectors can be readily fabricated using silicon MOS technology.

6 Claims, 4 Drawing Figures

EXTRINSIC INFRARED DETECTOR WITH DOPANT SITE CHARGE-NEUTRALIZATION

TECHNICAL FIELD

The present invention relates generally to semiconductor devices and more particularly to photodetectors intended for use in the infrared region and to monolithic arrays of such detectors.

BACKGROUND ART

Infrared imaging technology utilizing cooled arrays of either intrinsic or extrinsic semiconductor photodetectors is already in an advanced state of development. They have a sensitivity sufficient to permit real-time imaging of high quality to be achieved from objects at normal ambient temperatures. Infrared imagers also have applications in space where both man-made and celestial objects are being viewed against a very dark background.

With respect to two-dimensional arrays of imaging devices for use with visible light, a number of different types of devices have been proposed for different applications requiring different combinations of size, image quality, effective speed and cost. In particular, CCD (charge-coupled device) technology has been useful in the design and construction of monolithic arrays of visible imaging detectors. Visible light photons falling on the individual pixels (picture elements) during an appropriate "integration period" results in an increase in the stored charge associated with each pixel which may then be "read out" by the CCD.

Semiconductor device fabrication techniques for use with a silicon substrate have been under development and in commercial use for many years. It is the existence of this wealth of device technology (whereby metal-oxide-semiconductor (MOS) elements may be fabricated on a silicon subtrate so as to have practically any desired electrical characteristic) which has made silicon fundamental to a large class of imaging devices.

However, the individual photons in the infrared region have substantially less energy than those associated with the visible and ultraviolet (UV). Accordingly, the band gap associated with intrinsic silicon is too large to permit intrinsic silicon detectors to be used in the infrared. On the other hand, it is not presently feasible to adapt existing silicon-based visible (or UV) detectors and detector arrays to the infrared region merely by constructing them on a substrate having the required small energy gap because, at present, there is a lack of suitable device fabrication technology for such candidate materials.

It has been proposed to construct photocapacitive extrinsic silicon infrared detectors on a monolithic silicon substrate by doping certain active regions of the silicon substrate with shallow impurities having an energy level very close to one of the band edges. Phosphorous and boron are among the dopants that have been proposed for such devices, photodetection resulting in the generation of free carriers of one type only. Such devices are not readily adaptable for use with conventional X-Y addressing schemes because there is no way provided to replace the excited free carriers lost by the dopant so as to maintain electrical charge neutrality at the dopant sites.

It is accordingly an important object of the present invention to provide a photodetector device that can be fabricated as a two-dimensional array of X-Y addressable picture elements for use in an infrared camera or other suitable imaging application.

It is another object to provide an infrared photodetector utilizing silicon as a substrate whereby existing metal-oxide-semiconductor and charge-coupled device technology may be employed to fabricate a monolithic array.

It is another important object to provide a source of replacement carriers to replace the carriers excited from the dopant region of the extrinsic infrared detectors so as to maintain charge neutrality at the dopant sites.

Yet another important object of the present invention is to provide an infrared detector device wherein an external connection provides a path for replacing the carriers which have been excited by the incoming radiation.

Yet another important object is to provide an infrared detector device wherein an electrode generates a fringing field which causes the dopant band in an adjacent detector area to be "tipped" away from the equilibrium Fermi level so as to enhance the flow of excited carriers into a drain channel.

Yet another object is to provide an X-Y addressed array of infrared detector devices requiring only one gate electrode per line of such devices.

Still another object is to provide an infrared detector device which is defined by a channel stop which surrounds the detector so that no electrode is required on top of the detection region and that accordingly the device may be illuminated either from the top surface or from the rear surface.

Many types of prior art imaging devices are discussed at length at pages 241 through 295 of the book *Charge-coupled Devices and Systems* edited by M. J. Howes and D. V. Morgan and published in 1979 by John Wiley & Sons Ltd., Chichester, England. That discussion, and in particular section 5.4 thereof entitled "Infrared Imagers", is incorporated herein by reference, both as evidence of state of the prior art and for any assistance it may give the average artisan in making and using the present invention.

DISCLOSURE OF THE INVENTION

Briefly, the invention which is intended to achieve the above objects, and such other similar and related objects as will become apparent from the appended Detailed Description and the drawings, may be summarized as follows:

The device's detection area is defined by a relatively thin layer of extrinsic donor material that may be formed at the top of an intrinsic silicon substrate by means of diffusion, ion implantation or other equivalent MOS technologies. A source region is provided along at least a portion of the perimeter of the detection area and is electrically coupled thereby by means of an external connection. A drain channel is also provided which is separated from the detection area by a gate region. A gate electrode is provided above the gate region.

The donor material has an impurity energy level slightly below the conduction band of the silicon such that a photon of the wavelength of interest (for example near and/or far infrared) can excite an electron at one of the donor sites in the detection area from the impurity energy level into the conduction band. The concentration of the donor material in the detection area is sufficient for it to be at least a poor conductor. Thus, as excited electrons jump up into the conduction band, replacement electrons can flow into the donor band via the external connection provided between the source and the detection region thus maintaining electrical neutrality at the donor sites.

When a suitable potential is applied to the gate electrode, the excited electrons in the detection area's conduction band are free to flow into the drain channel and thence to an external device (which may be formed on the same substrate) for amplification, storage, transmission, and/or conversion to a digital signal.

The gate electrode is electrically insulated from the rest of the device. However, it overlaps a portion of the detection area and accordingly when a control voltage is applied to the gate electrode, it forms a fringing field extending into the detection area which further facilitates the conduction of the excited electrons in the detection area into the gate region (and thence to the drain channel) and also tends to pull the impurity energy level associated with the donor sites in the detection region below the equilibrium Fermi level thus ensuring that the donor sites from which electrons have been excited will be replenished so that the empty donor sites will not form a space charge which would prevent the electrons in the conduction band from conducting.

A plurality of such detectors can be conveniently fabricated in the form of a monolithic two-dimensional array wherein a first plurality of generally parallel drain channels are oriented as columns in a first direction and a second plurality of generally parallel gate electrodes are oriented as rows in a second direction. Each intersection between such a drain channel and such a gate electrode is associated with a particular detection area. The source regions may also be oriented as columns in said first direction and each such source column preferably is provided with a branch at each detection region so that most of the detection area (with the exception of the portion adjacent the gate region) is surrounded with a potential barrier that will prevent conduction electrons from escaping into adjacent array elements.

The foregoing description assumes an N-type device in which the flow of the electrons is from the source to the drain. Obviously a complementary P-type device is also possible.

BEST MODE OF CARRYING OUT THE INVENTION

Figure 1:
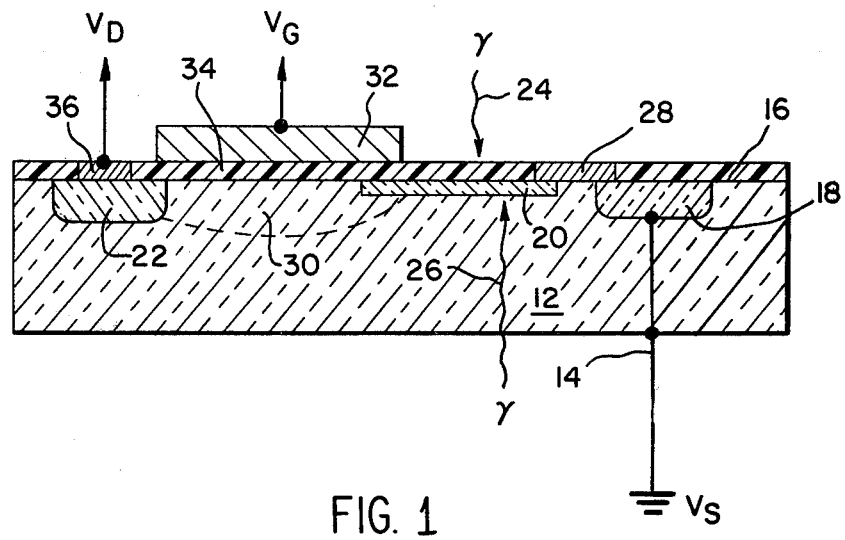
FIG. 1 is a schematic cross section diagram of a dopant-site charge-neutralized detection device constructed in accordance with the present invention.

The invention will now be described in detail with particular reference to a presently preferred embodiment thereof so that the average artisan will better be able to build and use the invention, not only with respect to embodiments such as are illustrated in the drawings but also with respect to such other embodiments as may be desirable or necessary for particular applications.

Referring initially to FIG. 1, which it will be recalled is a schematic cross section diagram of an infrared detector device constructed in accordance with the present invention, it should be noted that the depicted device is an N-type device that is formed on a weak P substrate of silicon (12). The substrate is grounded (14) and on its upper surface (16) there are three defined regions having different conductive properties to those of the weak P substrate (12). These three regions are a source region (18), a detector area (20) and a drain channel (22). Source region (18) is of conductivity type P+; drain channel (22) is of conductivity type N+. Both the source and the drain can conveniently be fabricated utilizing conventional MOS techniques. In the space between the source region (18) and the drain channel (22), there is additionally provided a detector area (20). This area is defined by a relatively thin layer of extrinsic N-type donor material that may be formed at the top of the substrate by means of diffusion, ion implantation or other similar MOS fabrication technologies. The donor material should be chosen such that its impurity energy level (see also FIGS. 2 and 3, and the discussion thereof which follows) is slightly below the conduction band of the silicon substrate so that a photon (24) having a relatively long wavelength (i.e., the infrared) can excite an electron from one of the donor sites within this layer of donor material so that the electron will jump up into the conduction band. Furthermore, the concentration of the donor material in the detection area (20) should be sufficient to cause it to be at least a poor N-type conductor. Since the substrate (12) is transparent, it is also possible for photons of interest to enter the detector area (20) from the rear (c.f., rear photon (26)).

An external metallic electrical connection (28) is provided between the source region (18) and the detector area (20). By means of this external connection (28), it is possible for replacement electrons to flow into the donor energy level band associated with the donor sites in the detection area thus maintaining electrical neutrality at the donor sites when electrons excited by photons (24 and 26) jump up into the conduction band (see also FIGS. 2 and 3). Separating the detector area (20) from the drain channel (22) is a gate region (30) that is structurally identical to the remainder of the substrate (12) but which in response to the application of a suitable gate potential to a gate electrode (32) becomes a depletion region through which conduction can take place from the detection area (20) to the drain channel (22). The gate electrode (32) is separated from the substrate's top surface (16) by an insulating layer (34) that may be a transparent oxide formed by conventional MOS techniques. The insulating layer (34) is interrupted to accommodate the aforesaid external contact (28) and also a second contact (36) through which electrical contact may be made to the drain channel (22).

Figure 2:
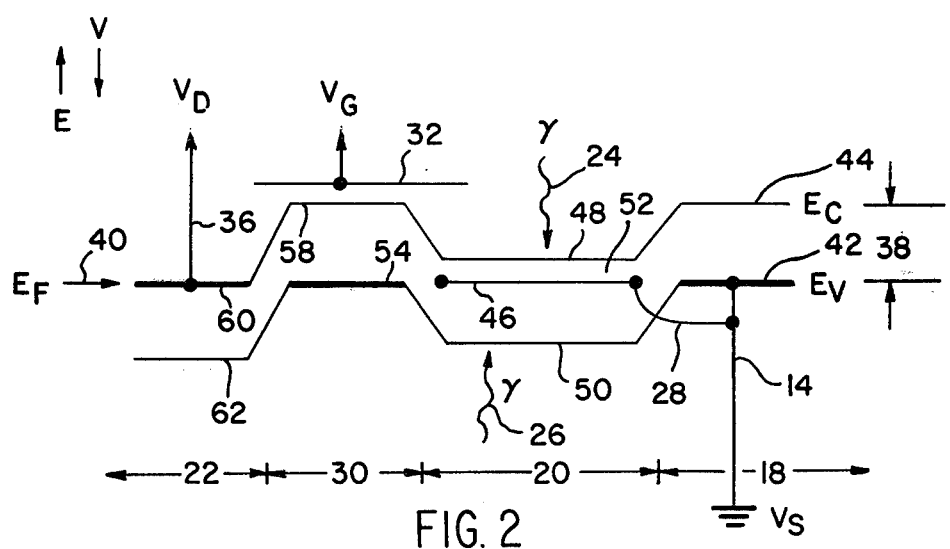
FIG. 2 is an energy band schematic diagram of the detector in its non-conductive state.

Referring now to FIG. 2, which it will be recalled is an energy band schematic diagram of the device of FIG. 1 in its non-conductive (or "integrating") condition, it will be seen that (as is conventional as such diagrams) the Fermi level at equilibrium (40) is shown as a horizontal line across the middle of the diagram and that (as indicated respectively by a pair of arrows (E,V)) a higher level on the diagram indicates a higher energy level and a lower voltage.

In FIG. 2, the same reference voltage numeral as employed previously with respect to FIG. 1 indicates an element having an analogous structure and function even though the two figures illustrate different aspects of the device, FIG. 1 being primarily structural and FIG. 2 being primarily functional. Commencing at the right hand portion of the Figure, it will be seen that the source region (18) is grounded (14) and is at a potential equal to that of the top of the valence band of the silicon forming the substrate (12). Spaced above the valence band (42) associated with the source region (18) is the source conduction band (44). It will be recalled that the energy gap (38) (that is to say, the distance from valence band (42) to conduction band (44)) is relatively large in the case of silicon—significantly larger than the energy contained in a photon of infrared light. In contrast, the donor energy band (46) is only slightly below the conduction band (48) associated with the detection area (20), and is well above the valence band (50), associated therewith. It will also be recalled that an external connection (28) is provided between the source region (18) and the detection area (20), thus the donor band (46) is at the same potential as the valance band (42) associated with the source region (18). Moreover, the gap (52) between the donor band (46) and the detector area conduction band (48) is sufficiently slight that infrared photons (24 and 26) will have sufficient energy to excite electrons from the donor band to the conduction band. Since the gate region (30) is formed of the same weak P-type material as the balance of the substrate (12) (see FIG. 1), its corresponding valence band (54) will be at the same Fermi equilibrium level as the donor band (46) and the source valence band (42). Its corresponding conduction band (58) is therefore at a distance above the Fermi equilibrium level equal to the aforementioned intrinsic silicon band gap (38). (The Figure depicts the gate electrode (32) as being above the gate depletion region (30) and partially overlapping the detection area (20); however, it should be understood that this Figure illustrates the device in its at-rest condition with no gate potential necessarily applied to the gate electrode (32)). At the left of the Figure, the drain channel (22) is shown with its conduction band (60) also at the Fermi equilibrium level, that is to say, at the same potential as the gate region valence band (54), the donor band (46) and the source region valence band (42). Spaced below the drain conduction band (60) by an amount equal to the conduction band gap (38) of the silicon is the drain valence band (62).

From FIG. 2 it will be apparent that even if an electron is excited from the donor band (46) into the conduction band (48) of the detection area, it will be confined to the detection area by potential barriers associated with the gate region (30) and the source region (18). Thus, at least until the saturation level of the device has been reached, as additional photons (24, 26) impinge on the detection area (20) additional electrons will be excited into detector area conduction band (48), these electrons being replaced from the source region (18) via the external contact (28) except for those that have in the meantime recombined with other donor sites.

Figure 3:
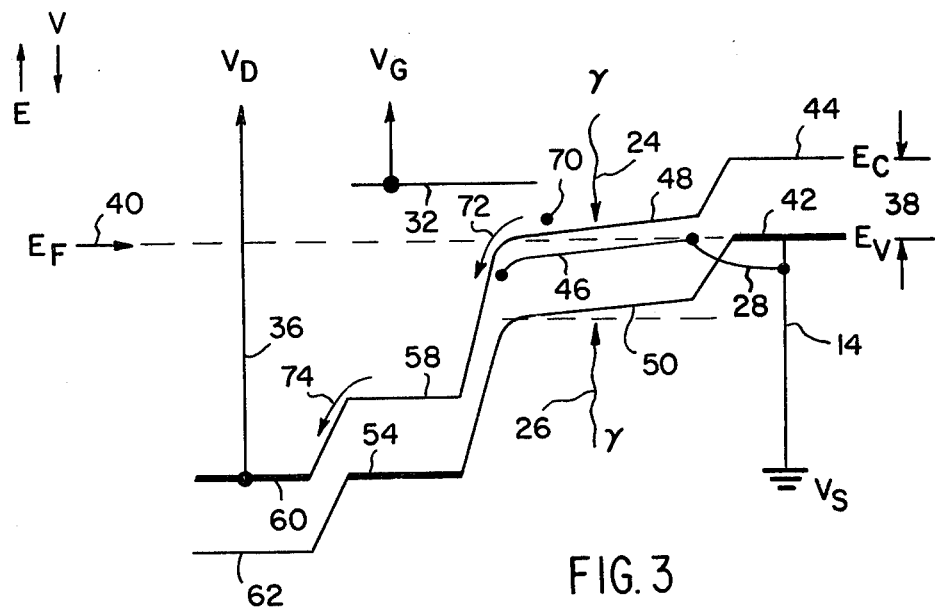
FIG. 3 is an energy band schematic diagram of the detector during the read-out process.

FIG. 3 is also an energy band schematic diagram, but shows the detector device of FIG. 1 in its read-out condition. Accordingly, the same conventions (and to the extent applicable, the same reference numerals) have been utilized in FIG. 3 as have been used in FIG. 2, and thus for the most part the above description of FIG. 2 is applicable to FIG. 3.

At the outset, it should be noted that FIG. 3 shows the energy levels associated with the various regions of the device when the respective drain and gate voltage potentials required to place the device in the read-out condition have been applied to the drain channel (22) and to the gate electrode (32). Accordingly, only the source region (18), the external contact (28) and the portion of detector area (20) immediately adjacent to the external connection (28) are at the equilibrium Fermi level (indicated by horizontal dashed line (40)). The remainder of the donor band (20) as well as the respective conduction bands (58 and 60) associated respectively with the gate region (30) and the drain channel (22) are well below the equilibrium Fermi level. Furthermore, the energy level of the gate region's conduction band (58) is somewhat intermediate between that of the adjacent detector region (20) on the one hand and that of the drain electrode (36) on the other hand. It will be noted that the source conduction band (44) remains above the Fermi level.

Accordingly, as is shown schematically in FIG. 3, an electron (70) that has been excited from the donor band (46) to an energy level in the detector area conduction band (48) will have sufficient energy to flow (down and to the left as indicated by a pair of curved arrows (72 and 74) until it reaches the drain electrode (36). Because the drain electrode (36) is maintained at an energy level much lower than that of the electron (70), when an excited electron first jumps into the conduction band (48) it will be swept towards the drain electrode (36) at a relatively rapid rate. Such a conduction of excited electrons is enhanced by a fringing effect from the gate region conduction band (58) being lower than the source region valence band (42) thus "tipping" the detection area conduction band (48). Thus, when the appropriate gate potential is applied to the gate electrode (32), it tends also to pull down the energy level of the adjacent donor band (46) and associated detector region conduction band (48), thereby sweeping the excited electrons out of the detection area (20) before they have had a chance to recombine with a donor site that has lost its electron. This fringing field also tends to facilitate the replenishment of electrons at excited donor sites via the external connection (28) and the source region (18). The charge at the drain electrode may then be carried to an amplifier or other external device connected to the drain channel (36) where the current and/or charge may be measured and thereby the input flux of photons arriving at the detection area (20) may be determined, since the output current of the device is proportional to the input photon flux. (In the event that the device has been in an integration condition prior to the initiation of the read-out, then the initial charge applied to the drain electrode (36) when the gate is first opened will correspond to the integral of the flux over the time period during which the integration took place).

Figure 4:
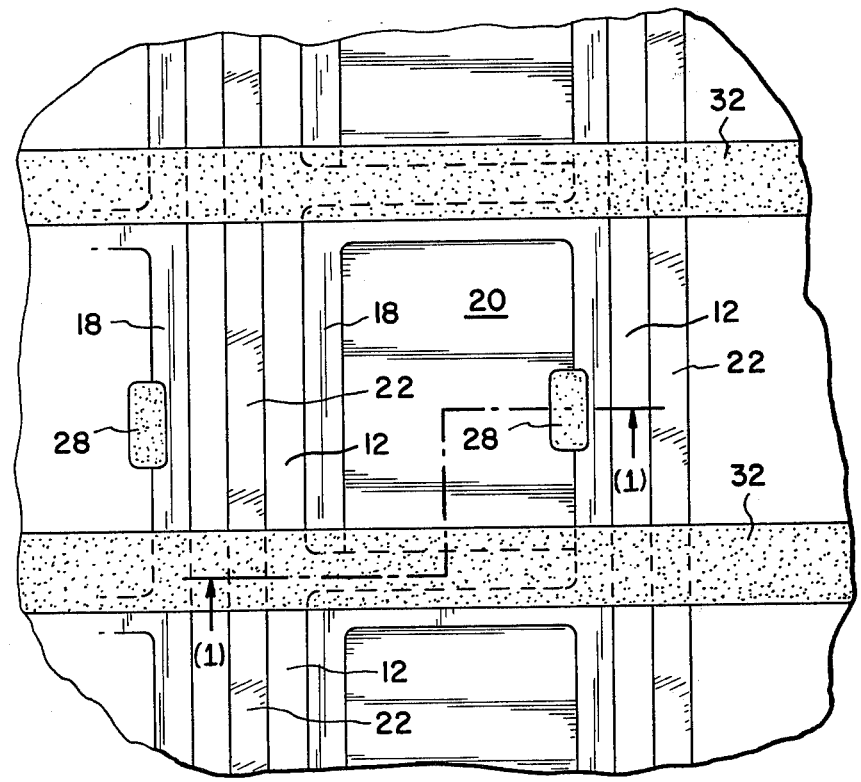
FIG. 4 is a top plan view of a portion of an array of detectors constructed in accordance with the present invention.

Particular reference now should be made to FIG. 4, which it will be recalled is a top plan view of a portion of an array of detectors constructed in accordance with the present invention. In particular, from this Figure it can be seen how the infrared detector device discussed previously with reference to FIGS. 1 through 3 can be fabricated as a two-dimensional array of X-Y addressable picture elements, such as may be used in an infrared camera or other suitable imaging application.

In the middle of the Figure can be seen a single active detector area (20). Along the bottom periphery of the detector area (20), there is provided the associated gate electrode (32) which extends horizontally to other elements in the array. Surrounding the other three sides of the middle detector area (20) there is defined the associated source region (18) which, it will be seen, extends vertically to adjacent picture elements along the detector area's right hand periphery and includes a separate extension for each picture element branching from the vertically extending channel on the right of the detector area (20) across its upper margin and down its left-hand side. The associated drain channel (22) also extends vertically to other elements and is located to the left of detector area (20). It is separated from the source region (18) by the same weak P substrate (12) which also extends below the gate electrode (32) so as to connect the lower edge of detector area (20) with the drain channel (22). The associated external connection (28) is shown in the Figure as being located at the center of the right-hand margin of the detector area (20) but it should be understood that its location is not critical to the operation of the device provided that it makes ohmic contact both with the source region (18) and with the doped detector area (20).

Since the gate electrode (32) extends horizontally, a single gate electrode is accordingly associated with an entire row of many picture elements. Furthermore, since the source region (18) and the drain channel (22) extend vertically and are electrically insulated from the horizontally extending gate electrodes (32) by the oxide insulating layer (34) (see FIG. 1), such a row of picture elements may be replicated many times in the vertical direction. Accordingly, by applying the appropriate potentials to a particular gate electrode (32) and a particular drain channel (22), the detector area associated with their intersection, namely the particular detector area (20) immediately above the selected gate electrode (32) and immediately to the right of the selected drain channel (22), will assume the read-out condition shown diagramically in FIG. 3 wherein it is supplying image intensity information to the external circuitry. At the same time, information from the remaining picture elements in the array is blocked on four sides by the permanent potential barrier established by the branched source region (18) and at the corner by the potential barrier from the gate region (30).

Still referring to FIG. 4, it may be seen that when a monolithic array of individual detector areas (20) is laid out in rows and columns with dimensional relationships approximately as indicated in the Figure, the active detector areas not covered by any electrodes is approximately 40% of the overall surface area of the semiconductor substrate upon which the array is fabricated. Thus, a relatively efficient use of the substrate has been made and yet the resultant imaging device may be illuminated from its top surface, thereby permitting the bottom surface of the substrate to be utilized for cooling. Furthermore, the geometries illustrated in FIG. 4 may be readily fabricated by means of conventional MOS techniques. In particular, by surrounding the detector area (20) by a branched extension of the source region (18), except for a small gap at the bottom left corner, the alignment of the gate electrode (32) is not particularly critical. Furthermore, the electrical contact (28) will perform its intended function as long as a portion thereof is in ohmic contact with the source region (18) and another portion thereof is in ohmic contact with the detector area (20).

Although the invention has been described with particular reference to a presently preferred embodiment, namely an N-type device formed on a weak P substrate of silicon, it should be understood that the invention should also find application for a complementary type of device, namely a P-type device formed on a weak N substrate in which the source region would be of conductivity type N+, the drain channel would be of conductivity type P+ and in which the detector area is formed with a P-type acceptor material. In such a complementary device, it should be understood that "holes" rather than electrons will be the majority carriers and accordingly the polarity of the voltages utilized to operate the device should be reversed.

Furthermore, there are other semiconductor materials in addition to silicon for which the present invention should find utility especially as improved fabrication technologies become commercially available for such other semiconductors. Among such other semiconductor materials may be listed, for instance, germanium, indium antimonide and gallium arsenide.

Finally, it should be observed that other array geometries are possible in which the shapes and relative locations of the various elements may be different from those discussed and illustrated herein.

Accordingly, the scope of the present invention should not be deemed as limited by any particular aspect of the preferred embodiment described and illustrated herein, but rather only by the broad scope of the appended claims in which the literal significance of various recited particular elements is to be construed as extended to encompass the various equivalents thereof, including, but not limited to those equivalents briefly discussed above.

What is claimed is:

1. A monolithic infrared detector comprising:
    a substrate formed from a substrate of semiconductive material, said substrate being of a first conductivity type;
    a detector area at the top of said substrate of extrinsic semiconductive material consisting essentially of said substrate semiconductive material and one or more dopants to form an extrinsic detector region, said detector region being of a second conductivity type;
    a source region formed from said substrate semiconductive material and being of said first conductivity type;
    a drain channel formed from said substrate semiconductive material and being of said second conductivity type;
    means for permitting the flow of carriers from within said detector area to said drain channel; and
    an external electrical contact between said source region and said detector area whereby charge neutrality at an extrinsic material site within said detector area may be maintained by carrier conduction from said source region through said external contact into said detector region and through said detector region to said extrinsic material site after a carrier at said site has been excited by a photon of infrared light and has flowed to said drain channel.

2. The detector of claim 1 further comprising:
    a gate electrode extending from above a portion of said detector area to above a portion of said drain channel whereby a depletion region may be selectively formed in a gate region defined by the portion of said substrate between said detector area and said drain channel underlying said electrode to thereby permit said flow of carriers from said detector area to said drain channel to be controlled.

3. The detector of claim 2 wherein the entire periphery of said detector area except for said gate region is surrounded by said source region.

4. An imaging device comprising a two-dimensional X-Y addressable array of detectors of the type recited in claims 2 or 3 whereby each said gate electrode extends in the X direction of said array and a particular said gate electrode is associated with more than one said detector area and wherein each said drain channel extends in the Y direction of said array and a second plurality of individual detector areas is associated with a particular said drain channel.

5. The imaging device of claim 4 wherein said substrate semiconductive material is selected from the group consisting of silicon, germanium, indium antimonide and gallium arsenide.

6. The imaging device of claim 4 wherein said substrate sémiconductive material is silicon and wherein said detector region is formed in said substrate by means of diffusion or ion implantation.

* * * * *